US012537479B2

(12) United States Patent
Datta et al.

(10) Patent No.: US 12,537,479 B2
(45) Date of Patent: Jan. 27, 2026

(54) SYSTEMS FOR OPERATING A LC-VCO (71) Applicant: Samsung Electronics Co., Ltd., Suwon-si (KR)

(72) Inventors: Subhadeep Datta, Bengaluru (IN); Vishnu Kalyanamahadevi Gopalan Jawarlal, Bengaluru (IN); Ankur Ghosh, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/933,044

(22) Filed: Oct. 31, 2024

(65) Prior Publication Data
US 2026/0025100 A1 Jan. 22, 2026

(30) Foreign Application Priority Data
Jul. 22, 2024 (IN) .............................. 202441055852

(51) Int. Cl.
*H03B 5/04* (2006.01)
*H03B 5/12* (2006.01)

(52) U.S. Cl.
CPC ............. *H03B 5/04* (2013.01); *H03B 5/1212* (2013.01); *H03B 2200/009* (2013.01)

(58) Field of Classification Search
CPC ........................................................ H03B 5/05
USPC ..................................................... 331/117 FE
See application file for complete search history.

(56) References Cited

U.S. PATENT DOCUMENTS

| 6,859,112 B2 | 2/2005 | Mason |
| 7,583,151 B2 | 9/2009 | Fan et al. |
| 7,602,260 B1 | 10/2009 | Atesoglu |

(Continued)

FOREIGN PATENT DOCUMENTS

CN  101299592 A  11/2008

OTHER PUBLICATIONS

S. Lightbody et al., "A-195 dBc/Hz FoMT 20.8-to-28-GHz LC VCO with Transformer-Enhanced 30% Tuning Range in 65-nm CMOS", IEEE Radio Frequency Integrated Circuits Symposium, Aug. 9, 2018.

(Continued)

*Primary Examiner* — Joseph Chang
(74) *Attorney, Agent, or Firm* — Fish & Richardson P.C.

(57) ABSTRACT

A system includes a low power, low phase-noise Inductance Capacitance voltage controlled oscillator (LC-VCO), a LC-VCO supply regulator configured to regulate a power supply to the LC-VCO, and a feedback network connected to the LC-VCO supply regulator. The feedback network is configured to track a process voltage temperature (PVT) variation of metal-oxide-semiconductor field-effect transistors (MOSFETs) used in a negative transconductance circuit of the LC-VCO, and to regulate a loop gain of the LC-VCO across PVT variation. The feedback network includes a first MOSFET, wherein the first MOSFET is configured to act as a switch, a first resistor connected across the first MOSFET, a current source device biased with a bandgap voltage, a diode and current-mirror pair, the diode and current-mirror pair including a second MOSFET and a third MOSFET, and a constant current source connected to the current source device and the diode and current-mirror pair.

13 Claims, 4 Drawing Sheets (56) References Cited

U.S. PATENT DOCUMENTS

| | | | |
|---|---|---|---|
| 7,616,072 B2 * | 11/2009 | Widmer | H03B 5/1243 |
| | | | 331/173 |
| 7,675,373 B2 | 3/2010 | Thaller | |
| 7,834,709 B2 * | 11/2010 | Saurabh | H03L 7/0995 |
| | | | 327/287 |
| 8,134,417 B2 | 3/2012 | Chiang et al. | |
| 8,228,132 B2 | 7/2012 | Kim et al. | |
| 8,531,245 B2 | 9/2013 | Joubert et al. | |
| 9,190,951 B2 | 11/2015 | Sadhu et al. | |
| 9,547,324 B2 * | 1/2017 | Vahid Far | G05F 1/575 |
| 10,187,071 B2 | 1/2019 | Arora et al. | |
| 10,333,465 B2 | 6/2019 | Vovnoboy et al. | |
| 2006/0077012 A1 * | 4/2006 | Shi | H03B 5/04 |
| | | | 331/74 |
| 2006/0158267 A1 * | 7/2006 | McCorquodale | H03L 7/0812 |
| | | | 331/34 |
| 2008/0272851 A1 | 11/2008 | Lin et al. | |
| 2013/0076450 A1 | 3/2013 | Rao et al. | |
| 2014/0028406 A1 | 1/2014 | Cao | |
| 2014/0292301 A1 * | 10/2014 | Lee | H03B 5/1253 |
| | | | 323/299 |
| 2017/0102418 A1 * | 4/2017 | Tumati | G01R 27/2605 |
| 2020/0177126 A1 * | 6/2020 | Liu | H03B 5/1212 |
| 2022/0107675 A1 * | 4/2022 | Kim | G06F 1/26 |

OTHER PUBLICATIONS

Luis Chen et al., "Adaptive biasing circuit overcoming process variation for high-speed circuits in scaled CMOS technology", IEEE International Symposium on VLSI Design, Automation and Test, Jun. 13, 2008.

* cited by examiner

SYSTEMS FOR OPERATING A LC-VCO

CROSS-REFERENCE TO RELATED APPLICATIONS

This application is based on and claims priority under 35 U.S.C. § 119 to Indian Patent Application No. 202441055852, filed on Jul. 22, 2024 in the Indian Patent Office, the disclosure of which is incorporated by reference herein in its entirety.

BACKGROUND

Field

Example embodiments disclosed herein relate to low power, low phase-noise Inductance Capacitance voltage controlled oscillators (LC-VCOs), and more particularly for improving the oscillator gain of an LC-VCO without affecting the frequency and the tuning range of the LC-VCO.

Related Art

LC-VCOs are used in applications such as, but not limited to, Phase Locked Loops (PLLs) for clock generation in high-speed transceivers. Low phase-noise makes LC-VCOs a natural choice for speeds ≥10 GHz, as it is extremely challenging to design ring VCOs for >10 GHz. Further, LC-VCOs have lower oscillator gain, frequency, and tuning ranges. Designing for a higher oscillator gain can degrade either the range or the reliability of the LC-VCO.

LC-VCOs operating at very high-speeds (≥10 GHz) are limited by the oscillator gain due to area (cannot use arbitrarily high inductance) and reliability (cannot have arbitrarily high tank supply) constraints. The oscillator gain of a low-voltage LC-VCO has high dependence on PVT conditions. This can lead to either a start-up failure or designing for a higher gain which leads to the loss of frequency and tuning range.

Existing solutions for oscillator gain improvement use calibration schemes. However, these calibration schemes increase LC-tank parasitics leading to loss of frequency and tuning range which is detrimental to very high-speed LC-VCOs.

If the LC-VCO tank-supply ($V_{REG}$) is generated using a conventional low-dropout regulator (LDO regulator), then the oscillator gain sees a heavy variation across all PVT conditions. This can lead to a start-up failure that calls for an over-design of the negative transconductance circuit. In doing so, the design sacrifices its frequency and tuning range, the phase-noise (and hence the RMS random jitter) and reliability.

SUMMARY

Some example embodiments of the present inventive concepts provide systems for improving the LC-VCO oscillator gain and reliability margin without compromising on frequency and tuning range and thus overcome the above mentioned drawback(s), among others.

Some example embodiments of the present inventive concepts provide systems for improving the LC-VCO oscillator gain and reliability margin, wherein the oscillator gain is increased in slow process corners and is reduced in fast process corners using a process-tracking supply voltage.

Some example embodiments of the present inventive concepts provide a modified feedback network based regulator to track the Process, Voltage, and Temperature (PVT) variation of Field Effect Transistors (FETs) used in a negative trans-conductance circuit of the LC-VCO tank, wherein the feedback network based regulator is implemented using current sources and FET switch.

Some example embodiments of the present inventive concepts provide systems for increasing the oscillator gain without having to use any calibration scheme or without increasing the LC-VCO tank parasitics.

Some example embodiments of the present inventive concepts provide a system comprising a low power, low phase-noise Inductance Capacitance voltage controlled oscillator (LC-VCO); an LC-VCO supply configured to regulate a power supply to the LC-VCO; and a feedback network connected to the LC-VCO supply regulator. The feedback network may include a first MOSFET, wherein the first MOSFET is configured to act as a switch; a first resistor connected across the first MOSFET; a current source device biased with a bandgap voltage; a diode and current-mirror pair that include a second MOSFET and a third MOSFET; and a constant current source (wherein the constant current source can be derived from bandgap reference using voltage-to-current converters) connected to the current source device and the diode and current mirror pair. The feedback network may be configured to track a process voltage temperature (PVT) variation of metal-oxide-semiconductor field-effect transistors (MOSFETs) used in a negative transconductance circuit of the LC-VCO oscillator. The feedback network may be further configured to regulate the loop gain of the LC-VCO across PVT variation.

These and other aspects of the example embodiments herein will be better appreciated and understood when considered in conjunction with the following description and the accompanying drawings. It should be understood, however, that the following descriptions, while indicating some example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF THE DRAWINGS

Embodiments herein are illustrated in the accompanying drawings, throughout which like reference letters indicate corresponding parts in the various figures. The embodiments herein will be better understood from the following description with reference to the following drawings. Some example embodiments herein are illustrated by way of examples in the accompanying drawings, and in which.

DETAILED DESCRIPTION

The example embodiments herein and the various features and advantageous details thereof are explained more fully with reference to some example embodiments that are illustrated in the accompanying drawings and detailed in the following description. Descriptions of well-known components and processing techniques are omitted so as to not unnecessarily obscure the example embodiments herein. The examples used herein are intended merely to facilitate an understanding of ways in which the embodiments herein may be practiced and to further enable those of skill in the art to practice the example embodiments herein. Accordingly, the examples should not be construed as limiting the scope of the example embodiments herein.

For the purposes of interpreting this specification, the definitions (as defined herein) will apply and whenever appropriate the terms used in singular will also include the plural and vice versa. It is to be understood that the terminology used herein is for the purposes of describing particular embodiments only and is not intended to be limiting. The terms "comprising", "having" and "including" are to be construed as open-ended terms unless otherwise noted.

The words/phrases "exemplary", "example", "illustration", "in an instance", "and the like", "and so on", "etc.", "etcetera", "e.g.,", "i.e.," are merely used herein to mean "serving as an example, instance, or illustration." Any example embodiment or implementation of the present subject matter described herein using the words/phrases "exemplary", "example", "illustration", "in an instance", "and the like", "and so on", "etc.", "etcetera", "e.g.,", "i.e.," is not necessarily to be construed as preferred or advantageous over other embodiments.

Some example embodiments herein may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by a firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the example embodiments may be physically separated into two or more interacting and discrete blocks without departing from the scope of the disclosure. Likewise, the blocks of the example embodiments may be physically combined into more complex blocks without departing from the scope of the disclosure.

It should be noted that elements in the drawings are illustrated for the purposes of this description and ease of understanding and may not have necessarily been drawn to scale. For example, the flowcharts/sequence diagrams illustrate the method in terms of the steps required for understanding of aspects of the example embodiments as disclosed herein. Furthermore, in terms of the construction of the device, one or more components of the device may have been represented in the drawings by conventional symbols, and the drawings may show only those specific details that are pertinent to understanding the present example embodiments so as not to obscure the drawings with details that will be readily apparent to those of ordinary skill in the art having the benefit of the description herein. Furthermore, in terms of the system, one or more components/modules which comprise the system may have been represented in the drawings by conventional symbols, and the drawings may show only those specific details that are pertinent to understanding the present embodiments so as not to obscure the drawings with details that will be readily apparent to those of ordinary skill in the art having the benefit of the description herein.

The accompanying drawings are used to help easily understand various technical features and it should be understood that the example embodiments presented herein are not limited by the accompanying drawings. As such, the present inventive concepts should be construed to extend to any modifications, equivalents, and substitutes in addition to those which are particularly set out in the accompanying drawings and the corresponding description. Usage of words such as first, second, third etc., to describe components/elements/steps is for the purposes of this description and should not be construed as sequential ordering/placement/occurrence unless specified otherwise.

Figure 1:
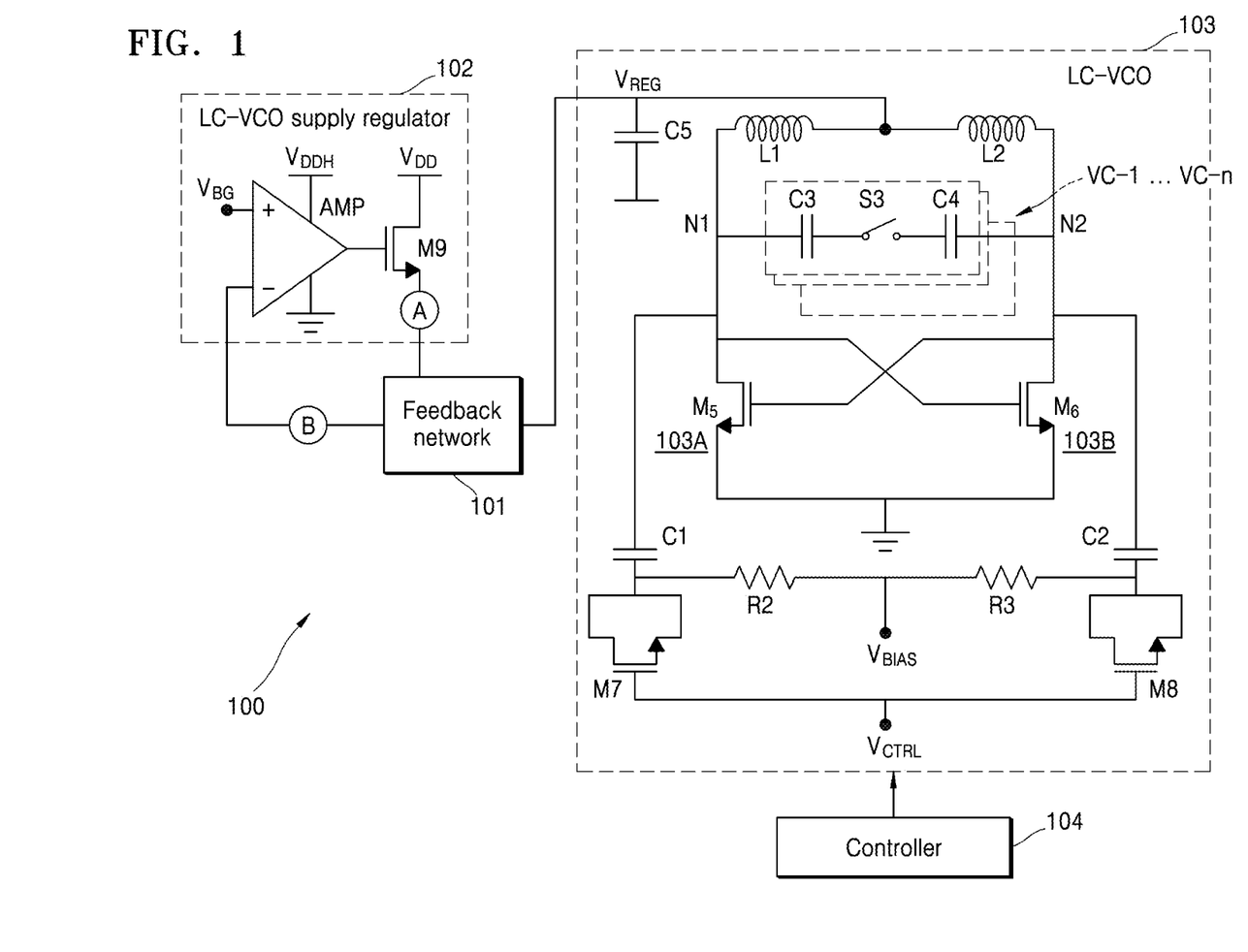
FIG. 1 depicts a system including a high-speed LC-VCO, according to some example embodiments of the present inventive concepts.
Figure 2:
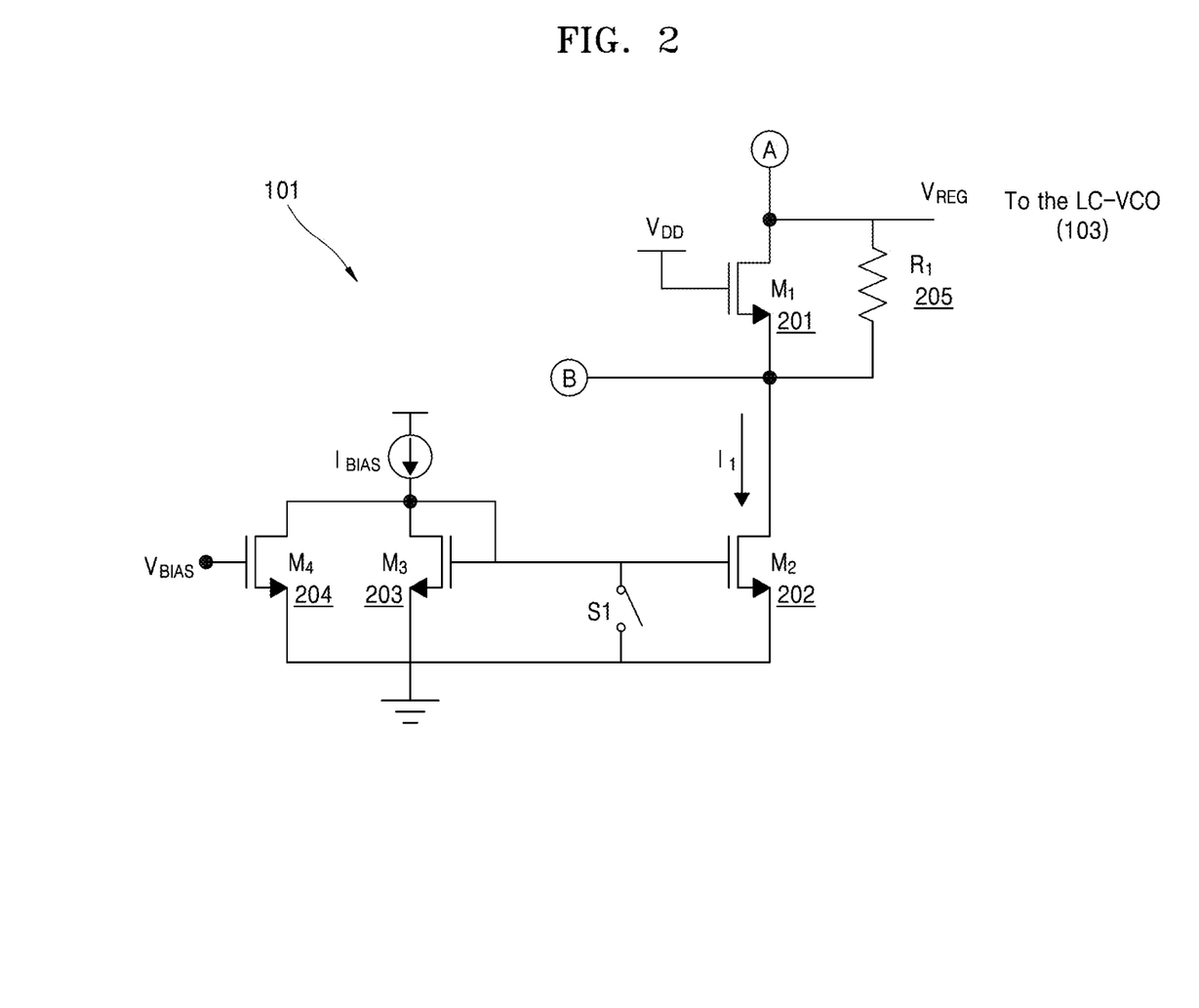
FIG. 2 depicts a feedback network, according to some example embodiments of the present inventive concepts.

Some example embodiments herein achieve systems for improving the LC-VCO oscillator gain and reliability margin without compromising on frequency and tuning range, which may thus improve functionality of such systems and any devices including same. Referring now to the drawings, and more particularly to FIGS. 1 through 2, where similar reference characters denote corresponding features consistently throughout the figures, there are shown embodiments.

Some example embodiments herein disclose systems for improving the LC-VCO oscillator gain and reliability margin without compromising on frequency and tuning range. Some example embodiments herein increase the oscillator gain in the slow process corner (e.g., a process corner associated with a clock frequency that is below a first threshold clock frequency) and reduce the oscillator gain in the fast process corner (e.g., a process corner associated with a clock frequency that is above a second threshold clock frequency that is greater than the first threshold clock frequency) using a process-tracking supply voltage, thereby providing improved functionality of said LC-VCO oscillators and thereby improving the functionality of devices that use the output of such oscillators. Some example embodiments herein disclose a modified feedback network based regulator to track the Process, Voltage, and Temperature (PVT) variation of Field Effect Transistors (FETs) used in a negative transconductance circuit of the LC-VCO tank, wherein the feedback network based regulator is implemented using current sources and at least one FET switch. Some example embodiments herein disclose systems for increasing the oscillator gain without having to use any calibration scheme or without increasing the LC-VCO tank parasitics. Some example embodiments herein generate a LC-VCO tank-supply ($V_{REG}$) using a bandgap reference voltage, wherein the bandgap voltage shows very limited variation, which can contain the spread of the oscillator gain across all PVT conditions.

FIG. 1 depicts a system 100 including a high-speed LC-VCO, according to some example embodiments of the present inventive concepts. The system 100, as depicted in FIG. 1, comprises a feedback network 101, a LC-VCO supply regulator 102, and a low power, low phase-noise Inductance Capacitance voltage controlled oscillator (LC-VCO) 103 (also referred to herein interchangeably as a LC-VCO tank, tank, and so on). The LC-VCO 103 can operate at high speeds (>10 GHz). The LC-VCO 103 can be connected to the LC-VCO supply regulator 102, wherein the LC-VCO supply regulator 102 can supply and regulate power to the LC-VCO 103. The LC-VCO supply regulator 102 can be further connected to the feedback network 101.

Referring to FIG. 1, the LC-VCO 103 may include a first inductor L1, a second inductor L2, one or more variable capacitors VC-1 to VC-n ("n" being any positive integer), the MOSFETs $M_5$ 103A and $M_6$ 103B, capacitors C1 and C2, resistors R2 and R3, and transistors M7 and M8. The first inductor L1 and the second inductor L2 may be connected in series between a first node N1 and a second node N2, and a positive supply voltage (LC-VCO tank supply ($V_{REG}$)) may be applied to a node to which the first inductor L1 and the second inductor L2 are connected and to which a capacitor C5 may be connected. Each variable capacitor VC-1 to VC-n may be connected between the first node N1 and the second node N2 (e.g., where n>1, the variable capacitors VC-1 to VC-n may be connected in parallel between the first node N1 and the second node N2) and thus may be connected to the first inductor L1 and the second inductor L2 in parallel, wherein the first inductor L1 and the second inductor L2 are connected in series. The variable capacitors VC-1 to VC-n may receive an input voltage VIN, and capacitance adjusted according to the input voltage VIN may be provided between the first node N1 and the second node N2. In some example embodiments, the variable capacitor VC may include capacitors C3 and C4 and a controllable switch S3 connected therebetween in series between the first and second nodes N1 and N2. One or more switches S3 of one or more variable capacitors VC-1 to VC-n may be controlled (e.g., by controller 104) to adjustably control capacitance between the first and second nodes N1 and N2. Accordingly, the resonance frequency may change, and an oscillation signal having the resonance frequency may be generated between the first node N1 and the second node N2.

As shown in FIG. 1, the system 100 may include a controller 104 which may apply a control voltage $V_{CTRL}$ to the LC-VCO 103 as shown. $V_{CTRL}$ is the control voltage of the VCO 103 which tunes the VCO frequency.

Still referring to the LC-VCO 103, a bandgap voltage $V_{BIAS}$ may be applied to a node to which both resistors R2 and R3 are connected, resistor R2 and capacitor C1 may be connected between said node and the first node N1, and resistor R3 and capacitor C2 may be connected between said node and the second node N2. $V_{BIAS}$ is the voltage used to bias the variable MOS capacitor. As further shown, the LC-VCO 103 may include transistors M7 and M8 having respective gates connected to a node to which a control voltage $V_{CTRL}$ may be applied. The source and drain of transistor M7 may be connected to a node that is connected between resistor R2 and capacitor C1. The source and drain of transistor M8 may be connected to a node that is connected between resistor R3 and capacitor C2.

Referring to FIG. 1, the LC-VCO supply regulator 102 may include an amplifier AMP and a transistor M9. The amplifier AMP may have a non-inverting input receiving a bandgap voltage $V_{BG}$ and an inverting input connected to the feedback network 101 and have an output connected to a gate of the transistor M9. The VBG is the bandgap voltage which acts as a reference to the regulators. The transistor M9 may be an NFET, and as shown in FIG. 1, the transistor M9 may include a drain to which the supply voltage VDD is applied, a gate to which an output voltage of the amplifier AMP is applied, and a source connected to the feedback network 101.

The LC-VCO supply regulator 102 and the feedback network 101 may provide and/or regulate a supply voltage ($V_{REG}$), or power supply, to the LC-VCO 103, which increases the gain of the LC-VCO 103 in slow process corner(s) (i.e., the LC-VCO tank supply ($V_{REG}$) is high in slow process corner(s)) and reduces the gain of the LC-VCO 103 in the fast process corner(s) (i.e., the LC-VCO tank supply ($V_{REG}$) is low in fast process corner(s)). Due to random variation during fabrication of chip, uniform doping cannot be guaranteed. Due to this nonuniformity, some chips have higher doping, lower threshold voltage (~nominal value−25%), lower delay, higher transconductance—which are termed as 'Fast' process corners. At the same time, some chips have lower doping, higher threshold voltage (~nominal value+25%), higher delay and lower transconductance. The LC-VCO supply regulator 102 may provide a process variation tracking supply (e.g., provide a provide a process variation tracking of power supply) to the LC-VCO 103, which can make the LC-VCO 103 low power and low phase noise. The LC-VCO supply regulator 102 may regulate the spread of the loop gain of the LC-VCO 103 across all PVT conditions/variations and reduce a parasitic capacitance of the LC-VCO 103 (which can include increased frequency and tuning ranges of the LC-VCO 103), along with the feedback network 101. The LC-VCO supply regulator 102 may regulate the tank supply $V_{REG}$ (e.g., power supply) in such a way that it (the power supply) increases in slow process corners, and decreases in fast process corners. In some example embodiments herein, regulating the loop gain of the LC-VCO 103 across all PVT conditions/variations can include ensuring that the loop gain is always greater than 1, thereby ensuring that there is no oscillator start-up failure, and thus improving the reliability and/or performance of the system 100 and any device including same.

The feedback network 101 may track the process voltage temperature (PVT) variation of metal-oxide-semiconductor field-effect transistors (MOSFETs) used in a negative transconductance circuit of the LC-VCO 103. In some example embodiments herein, the MOSFETs $M_5$ 103A and $M_6$ 103B form a negative cross-connected gain device in the negative transconductance circuit of the LC-VCO 103. The feedback network 101 may further regulate a loop gain of the LC-VCO 103 across PVT variation. The PVT variation means mimicking the transistor parameters like threshold voltage, transconductance, etc., across process, voltage and temperature (PVT) conditions.

The LC-VCO supply regulator 102 and the feedback network 101 may increase the gain of the LC-VCO 103, without having to use any calibration scheme or without increasing the LC-VCO tank parasitics, or without compromising on frequency and tuning range. As a result, a performance and/or reliability, and thus functionality, of the system 100 and any device including same may be improved.

FIG. 2 depicts the feedback network 101 shown in FIG. 1, according to some example embodiments of the present inventive concepts. The feedback network 101, as depicted, includes a plurality of MOSFETs 201, 202, 203, 204 and a first resistance (first resistor) $R_1$ 205.

A fourth MOSFET $M_4$ 204 is a current source device biased with a bandgap voltage $V_{BIAS}$. In some example embodiments herein, the MOSFET gate voltage is biased with a bandgap voltage (wherein the bandgap voltage shows very limited variation). The fourth MOSFET $M_4$ 204 can sink process-dependent current from a constant current source $I_{BIAS}$. In some example embodiments herein, the constant current source $I_{BIAS}$ can be derived from the bandgap reference using voltage-to-current converters. The current sunk by the fourth MOSFET $M_4$ 204 reaches maxima in the fast process corner and minima in the slow process corner.

A pair of MOSFETs $M_2$-$M_3$ 202-203 form a diode and current-mirror pair. As a result, current though the second MOSFET $M_2$ 202 can have a high dependence on process voltage temperature (PVT) ($I_1$), as shown in Equation (1) below.

$$I_1 = N \times (I_{BIAS} - 0.5 \times \mu_n C_{OX} (W/L) \times (V_{BIAS} - V_T)^2) \quad (1)$$

In Equation (1), N is a current mirroring ratio, $\mu_n$ is a mobility of the second MOSFET $M_2$ 202, $C_{OX}$ is a gate oxide capacitance of the second MOSFET $M_2$ 202, W is a width of the gate of the second MOSFET $M_2$ 202, L is a length of the gate of the second MOSFET $M_2$ 202, $V_{BIAS}$ is a gate bias voltage of the second MOSFET $M_2$ 202, and $V_T$ is a threshold voltage of the second MOSFET $M_2$ 202.

Current sunk by the third MOSFET $M_3$ 203 may reach a maxima in the slow process corner and a minima in the fast process corner; i.e., $I_1$ is maximum in slow process corner and minimum in fast process corner. This may be considered to be a $1^{st}$ level of PVT dependence (tracking).

A first MOSFET $M_1$ 201 can act as a switch. The first resistance $R_1$ 205 is connected across the first MOSFET $M_1$ 201. The first MOSFET $M_1$ 201 may be biased to operate in linear region as a switch (with the first resistance $R_1$ 205). The source of the MOSFET switch $M_1$ 203 is set to the bandgap reference voltage by a negative feedback around the loop. By set, the negative feedback makes sure that the source of the first MOSFET is equal to the bandgap reference voltage.

The device characteristics (e.g., structure, size, material composition, etc.) of the first MOSFET $M_1$ 201 may be the same as the MOSFETs $M_5$, $M_6$ 103A, 103B in the negative cross-connected gain device in the negative transconductance circuit of the LC-VCO 103. This may be considered to be a $2^{nd}$ level of PVT dependence (tracking). The device characteristics means mimicking the transistor parameters like threshold voltage, transconductance, etc., across process, voltage and temperature (PVT) conditions.

The first resistance $R_1$ 205 (also referred to herein as the MOSFET switch resistance $R_1$ 205, first resistor, and the like) is connected across the MOSFET $M_1$ 201 to limit the maximum voltage drop across MOSFET $M_1$ 201 to ensure linear mode of operation for the MOSFET $M_1$ 201. The parallel resistor across the first MOSFET ensures that the voltage across the MOSFET is kept lower than overdrive voltage (a property of a MOSFET) to keep it working in linear/triode mode of operation. By linear/triode mode of operation is when the MOSFET behaves like a resistor where the voltage across the MOSFET is proportional to the current flowing through it. The MOSFET switch resistance $R_1$ 205 may be at a maximum value based on the system 100 operating in the slow process corner and at a minimum value based on the system 100 operating in the fast process corner. In some example embodiments herein, the MOSFET switch resistance $R_1$ 205 can be an intentional metal resistor.

The voltage drop across the first MOSFET $M_1$ 201 is $I_1 \times R_{SW}$, where both the terms are tracking the PVT-dependence of the negative transconductance circuit. The first MOSFET $M_1$ 201, biased in linear region acts as a switch. $R_{SW}$ is the switch resistance of the first MOSFET $M_1$ 201. The voltage drop across the MOSFET $M_1$ 201 may be at a maximum value based on the system 100 operating in the slow process corner and at a minimum value based on the system 100 operating in the fast process corner.

Therefore, the voltage supply to the LC-VCO 103 ($V_{REG}$) may mimic PVT-dependence of the negative transconductance circuit used in the LC-VCO 103, as shown in Equation (2) below.

$$V_{REG} = V_{BG} + I_1 \times (R_{SW} \| R_1) \quad (2)$$

In Equation (2), $V_{REG}$ is the output of the regulator which is used as the LC-tank supply, $R_1$ is the resistance of the intentional metal resistor (e.g., first resistor 205) used parallel to the first MOSFET $M_1$ 201, and $V_{BG}$ is the bandgap voltage (wherein the bandgap voltage shows very limited variation).

A controllable switch S1 may be connected to a node between the gates of MOSFETs $M_3$ 203 and $M_2$ 202 and may be further connected between said node and the ground, such that the switch S1 may be controlled to controllably connect said node to ground.

The LC-VCO supply regulator 102 may bring down maximum swing in very high gain conditions (e.g., in response to the loop gain of the LC-VCO being above a first particular threshold loop gain value). The LC-VCO supply regulator 102 may bring up minimum swing in very low swing conditions. During the maximum swing condition, the oscillator gain is high and the oscillator swing is ~2 times the regulator voltage. On the other hand, the minimum swing condition is meant when the oscillator gain is near 1 and the oscillator swing is ~75% of the regulator voltage. The LC-VCO supply regulator 102 may bring up minimum swing in very low gain conditions (e.g., in response to the loop gain of the LC-VCO being below a second particular threshold loop gain value that is below the first particular threshold loop gain value). During the high gain condition, the oscillator gain is more than 4 and the low gain condition is when oscillator gain is less than 1 which translates to no oscillation. In general, the oscillator gain is greater than 1 (>1) is a sufficient and necessary condition.

Some example embodiments herein can totally avoid occurrences of oscillator start-up failure. Some example embodiments herein can provide a 12% increase in frequency range of the LC-VCO 103. Some example embodiments herein can provide a 5% increase in tuning range of the LC-VCO 103. Some example embodiments herein can provide a 10% reduction in RMS random jitter of the LC-VCO 103. Some example embodiments of the system 100 may provide a 10% reduction in current consumption of the LC-VCO 103, based on further reducing the metal parasitics by 10%. Some example embodiments of the system 100 may provide a 75% improved device reliability (e.g., reliability of a device including the system 100) with aging. Some example embodiments herein can achieve additional phase noise/jitter optimization, if improvement in frequency and tuning range is not desired.

Figure 3:
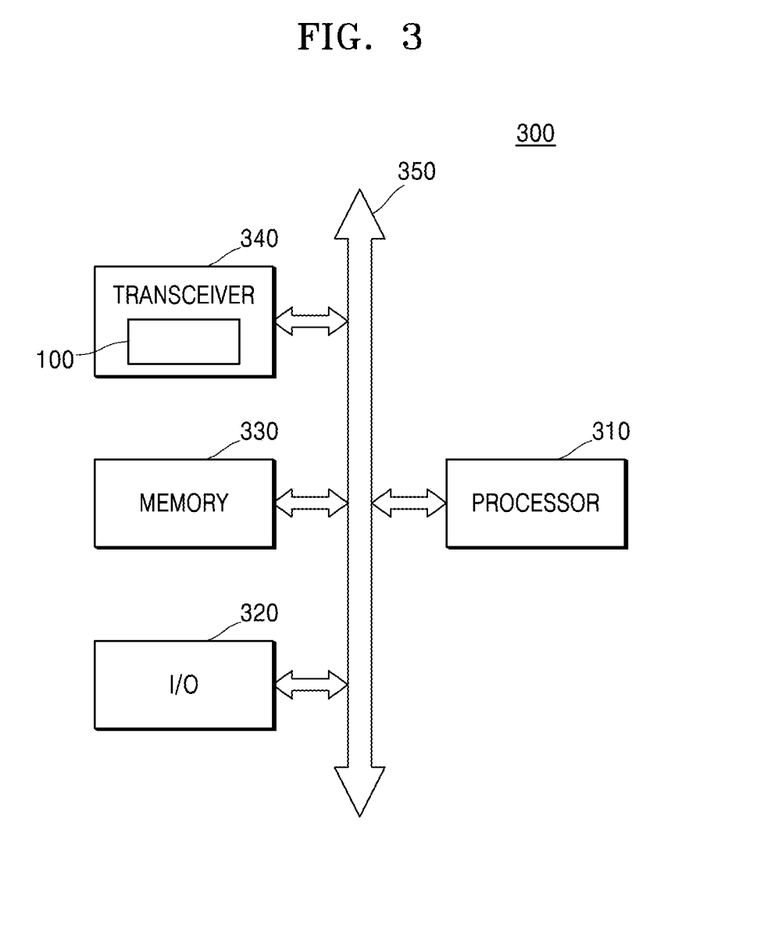
FIG. 3 is a schematic block diagram of an electronic device according to some example embodiments of the present inventive concepts.

FIG. 3 is a schematic block diagram of an electronic device 300 according to some example embodiments of the present inventive concepts.

Referring to FIG. 3, an electronic device 300 may include a processor 310, an input/output device (I/O) 320, a memory device 330, and a transceiver 340, which are respectively connected to one another through a bus 350. In some example embodiments, the input/output device 320 may be omitted from the electronic device 300. At least one of the processor 310, the input/output device 320, the memory device 330, or the transceiver 340 may include one or more systems 100 including a high-speed LC-VCO according to some example embodiments of the present inventive concepts.

The processor 310 may include at least one of a microprocessor, a digital signal processor, or a processing device similar thereto. The input/output device 320 may include at least one of a keypad, a keyboard, or a display. The memory device 330 may include a non-transitory computer readable medium configured to store a program of instructions (e.g., a solid state drive memory device). The memory device 330 may be used to store commands executed by the processor 310. For example, the memory device 330 may be used to store user data. The transceiver 340 may include a wireless communication interface (e.g., a wireless communication transceiver, a wired communication transceiver, or any combination thereof). The transceiver 340 may include an antenna and/or a wireless transceiver. The electronic device 300 may use the transceiver 340 to transmit/receive data over a communication network (e.g., a wireless communication network, a wired communication network, or any combination thereof).

The electronic device 300 and/or any portion thereof (e.g., the processor 310, the memory device 330, the input/output device 320, the transceiver 340, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD) device, storing a program of instructions, and a processor (e.g., a CPU) configured to execute the program of instructions to implement the functionality and/or methods performed by some or all of the electronic device 300 and/or any equipment and/or methods implemented and/or controlled thereby.

Referring to FIG. 3 in view of FIGS. 1 and 2, an electronic device 300 may have improved functionality, including for example improved performance reliability, based on including a system 100 that includes an LC-VCO 103, an LC-VCO supply regulator 102, and a feedback network 101 and where the electronic device 300 may perform one or more operations based on an output of the LC-VCO 103 according to some example embodiments. For example, in example embodiments where the transceiver 340 includes the system 100 and utilizes an output signal of the LC-VCO 103, the transceiver 340 may have improved reliability based on including the system 100, based on at least one of avoidance of occurrences of oscillator start-up failure of the LC-VCO 103, increased frequency range of the LC-VCO 103, increased tuning range of the LC-VCO 103, reduced RMS random jitter of the LC-VCO 103, reduced current consumption of the LC-VCO 103 (e.g., based on reduced metal parasitics), any combination thereof, or the like. For example, in example embodiments where the transceiver 340 includes the system 100, the transceiver 340 may have improved device reliability with aging based on including the system 100. For example, in example embodiments where the transceiver 340 includes the system 100, the transceiver 340 may have improved functionality and/or reliability due to additional phase noise/jitter optimization based on including the system 100.

Figure 4:
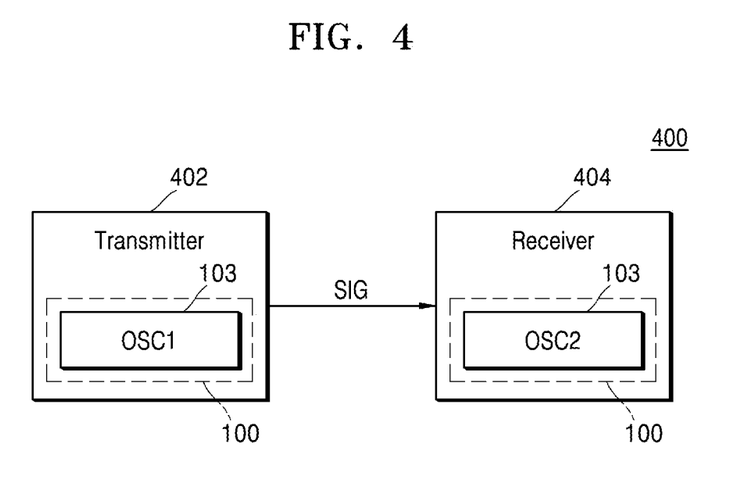
FIG. 4 is a block diagram of a communication system according to some example embodiments of the present inventive concepts.

FIG. 4 is a block diagram of a communication system 400 according to some example embodiments of the present inventive concepts. The system 100 described above with reference to the attached drawings may be included in the communication system 400. As shown in FIG. 4, the communication system 400 may include a transmitter 402 and a receiver 404.

The transmitter 402 may transmit a signal SIG to the receiver 404 through a communication channel. In some example embodiments, the communication channel may be a wireless communication channel. For example, the communication system 400 may be a cellular communication system, such as long term evolution (LTE), LTE-advanced (LTE-A), new radio (NR), wireless broadband (WiBro), or global system for mobile communication (GSM), a near-field communication system, such as Bluetooth or near field communication (NFC), or a wireless local area network (WLAN) system, such as the IEEE 802.11 standard. In some example embodiments, the communication channel may be a wired communication channel. For example, the communication system 400 may include a bus, such as a peripheral component interconnect (PCI), or serial communication, such as a universal serial bus (USB).

As shown in FIG. 4, the transmitter 402 may include an LC-VCO OSC1, and the LC-VCO OSC1 may be used to generate the signal SIG. Also, the receiver 404 may include an LC-VCO OSC2, and the LC-VCO OSC2 may be used to process the signal SIG. For example, when the communication system 400 is a wireless communication system, an oscillation signal generated by the LC-VCO OSC1 of the transmitter 402 may be used to generate a radio frequency (RF) signal by up-converting a baseband signal. Also, an oscillation signal generated by the LC-VCO OSC2 of the receiver 404 may be used to generate a baseband signal by down-converting the RF signal. When the communication system 400 is a wired communication system, the LC-VCO OSC1 of the transmitter 402 and the LC-VCO OSC2 of the receiver 404 may be included in a serializer/deserializer (SerDes).

As described above with reference to the attached drawings, each of the transmitter 402 and the receiver 404 may include the system 100 shown in FIG. 1. Accordingly, the communication system 400 may have improved functionality, including for example improved performance reliability, based on including a system 100 according to some example embodiments. For example, in example embodiments where the transmitter 402 and/or the receiver 404 includes the system 100, the transmitter 402 and/or the receiver 404 may have improved reliability based on including the system 100, based on at least one of avoidance of occurrences of oscillator start-up failure of the LC-VCO OSC1 and/or OSC2, increased frequency range of the LC-VCO OSC1 and/or OSC2, increased tuning range of the LC-VCO OSC1 and/or OSC2, reduced RMS random jitter of the LC-VCO OSC1 and/or OSC2, reduced current consumption of the LC-VCO OSC1 and/or OSC2 (e.g., based on reduced metal parasitics), any combination thereof, or the like. For example, in example embodiments where the transmitter 402 and/or the receiver 404 includes the system 100 according to some example embodiments, the transmitter 402 and/or the receiver 404 may have improved device reliability with aging based on including the system 100. For example, in example embodiments where the transmitter 402 and/or the receiver 404 includes the system 100, the transceiver 340 may have improved functionality and/or reliability due to additional phase noise/jitter optimization based on including the system 100.

As described herein, any devices, systems, units, blocks, circuits, controllers, and/or portions thereof according to any of the example embodiments (including, for example, controller 104, electronic device 300, transmitter 402, receiver 404, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid-state drive memory device, storing a program of instructions, and a processor (e.g., CPU) configured to execute the program of instructions to implement the functionality and/or methods performed by some or all of any devices, systems, units, blocks, circuits, controllers, and/or portions thereof according to any of the example embodiments.

The foregoing description of some example embodiments will so fully reveal the general nature of the embodiments herein that others can, by applying current knowledge, readily modify and/or adapt for various applications such example embodiments without departing from the generic concept, and, therefore, such adaptations and modifications should and are intended to be comprehended within the meaning and range of equivalents of such example embodiments. It is to be understood that the phraseology or terminology employed herein is for the purpose of description and not of limitation. Therefore, while some example embodiments herein have been described, those skilled in the art will recognize that the example embodiments of the present inventive concepts can be practiced with modification within the scope of the example embodiments as described herein.

We claim:

1. A system, comprising:
a low power, low phase-noise Inductance Capacitance voltage controlled oscillator (LC-VCO);
a LC-VCO supply regulator configured to regulate a power supply to the LC-VCO; and
a feedback network connected to the LC-VCO supply regulator, the feedback network configured to
track a process voltage temperature (PVT) variation of metal-oxide-semiconductor field-effect transistors (MOSFETs) used in a negative transconductance circuit of the LC-VCO, and
regulate a loop gain of the LC-VCO across PVT variation,
wherein the feedback network includes
a first MOSFET, wherein the first MOSFET is configured to act as a switch,
a first resistor connected across the first MOSFET,
a current source device biased with a bandgap voltage,
a diode and current-mirror pair, the diode and current-mirror pair including a second MOSFET and a third MOSFET, and
a constant current source connected to the current source device and the diode and current-mirror pair.

2. The system of claim 1, wherein regulating the loop gain of the LC-VCO across the PVT variation comprises ensuring that the loop gain is always greater than 1.

3. The system of claim 1, wherein
the first MOSFET is biased to operate in linear region as a switch, and
the system is configured to cause a voltage drop across the first MOSFET to
track a process voltage temperature (PVT) dependence of the negative transconductance circuit of the LC-VCO, and
be at a maximum value based on the system operating in a slow process corner associated with a clock frequency that is below a first threshold clock frequency and be at a minimum value based on the system operating in a fast process corner associated with a clock frequency that is above a second threshold clock frequency that is greater than the first threshold clock frequency.

4. The system of claim 3, wherein the first MOSFET has same device characteristics as a negative cross-connected gain device in the negative transconductance circuit.

5. The system of claim 3, wherein the first MOSFET is configured to have a switch resistance that is at a maximum value based on the system operating in the slow process corner and a minimum value based on the system operating in the fast process corner.

6. The system of claim 1, wherein
the first resistor is an intentional metal resistor, and
the first resistor is configured to limit a maximum voltage drop across the first MOSFET to ensure linear mode of operation for the first MOSFET.

7. The system of claim 1, wherein the system is configured to set a source of the first MOSFET to a bandgap reference voltage based on a negative feedback around a loop.

8. The system of claim 1, wherein the current source device is configured to sink a process-dependent current from the constant current source.

9. The system of claim 1, wherein the system is configured to cause current sunk by the third MOSFET to reach a maximum value in a slow process corner associated with a clock frequency that is below a first threshold clock frequency and a minimum value in a fast process corner associated with a clock frequency that is above a second threshold clock frequency that is greater than the first threshold clock frequency.

10. The system of claim 1, wherein the LC-VCO supply regulator is configured to provide a process variation tracking of the power supply to the LC-VCO.

11. The system of claim 1, wherein the LC-VCO supply regulator is configured to:
bring down maximum swing in response to the loop gain of the LC-VCO being above a first particular threshold loop gain value; and
bring up minimum swing in response to the loop gain of the LC-VCO being below a second particular threshold loop gain value that is smaller than the first particular threshold loop gain value.

12. The system of claim 1, wherein the LC-VCO supply regulator is configured to reduce a parasitic capacitance of the LC-VCO.

13. The system of claim 12, wherein the LC-VCO supply regulator is configured to increase a frequency and tuning range of the LC-VCO, based on reducing the parasitic capacitance of the LC-VCO.

* * * * *